US005391999A

United States Patent [19]
Early et al.

[11] Patent Number: 5,391,999
[45] Date of Patent: Feb. 21, 1995

[54] GLITCHLESS SWITCHED-CAPACITOR BIQUAD LOW PASS FILTER

[75] Inventors: Adrian B. Early, Buda; Jeffrey D. Ganger, Austin, both of Tex.

[73] Assignee: Motorola Inc., Schaumburg, Ill.

[21] Appl. No.: 160,136

[22] Filed: Dec. 2, 1993

[51] Int. Cl.⁶ ............................................. H03K 5/00
[52] U.S. Cl. .................................. 327/337; 327/345; 327/554
[58] Field of Search ................ 307/490, 494, 497, 520, 307/523, 522; 328/127, 167

[56] References Cited

U.S. PATENT DOCUMENTS

| | | | |
|---|---|---|---|
| 4,315,227 | 2/1982 | Fleischer | 328/167 |
| 4,438,354 | 3/1984 | Haque et al. | 328/127 |
| 4,584,532 | 4/1986 | Duehren et al. | 328/167 |
| 4,795,987 | 1/1989 | Gay | 330/107 |
| 4,835,482 | 5/1989 | Tamakoshi et al. | 328/167 |
| 4,894,620 | 1/1990 | Nagaraj | 328/127 |
| 4,924,189 | 5/1990 | Senn et al. | 328/127 |
| 4,996,529 | 2/1991 | Connell | 341/118 |
| 5,142,236 | 8/1992 | Maloberti et al. | 328/127 |
| 5,187,445 | 2/1993 | Jackson | 328/167 |

OTHER PUBLICATIONS

A Family of Active Switched Capacitor Biquad Building Blocks (by P. E. Fleischer et al.) vol. 58, No. 10, Dec. 1979.
MOS Switched Capacitor Analog Sampled Data Direct-Form Recursive Filters by Ian Young et al. (IEEE. Journal of Solid State Circuits, vol. SC14, No. 6, Dec. 1979).
Improved Circuits for Realization of Switched Capacitor Filters by Martin (Proceeding of the 1979 International Symposium on Circuits and Sys. Tokyo, Japan 17-19 Jul. 1979).
Stray Sensitive State Space Switched Capacitor Filters (by Masry, IEEE vol. CAS30, No. 7 Jul. 1983).
Switched-Capacitor Circuit Design (by Gregorian et al. IEEE vol. 71, No. 8 Aug. 1983).
A Multiplexers Switched Capacitor Filter Bank (by Bosshart, IEEE vol. SC-15, No. 6 (Nov. 1980).
Continuous-Time MOSFET-C Filters in VLSI. (by Tsividis et al. IEEE vol. SC-21, No. 1, Feb. 1986).
K. Nagaraj et al., "Reduction of Finite-Gain Effect in Switched-Capacitor Filters", Electronics Letters, Jul. 18, 1985, pp. 644-645.
R. Gregorian, "Filtering techniques with switched-capacitor circuits", Microelectronics Journal, vol. 11, No. 2, 1980, pp. 13-21.
R. Gregorian, "Switched-Capacitor Filter Design Using Cascaded Sections", IEEE Transactions on Circuits and Systems, vol. Cas-27, No. 6, Jun. 1980, pp. 515-521.

*Primary Examiner*—John S. Heyman
*Assistant Examiner*—T. T. Lam
*Attorney, Agent, or Firm*—Daniel D. Hill

[57] ABSTRACT

A fully differential switched-capacitor biquad low pass filter (40) includes a first stage (54), second stage (56), common-mode circuits (55, 72), and feedback transmission gates (73, 74). The first stage (54) includes a first operational amplifier (47), and the second stage (56) includes a second operational amplifier (69). Glitches, or transients, which are caused by the operational amplifiers (47, 69) operating in slew rate limit mode, are prevented from affecting the differential output signals of the filter (40) when the filter (40) is operating with a continuous time output. This is accomplished by preventing the operational amplifiers (47, 69) from operating in slew rate limit mode, or by adjusting the clock signals such that the output of the filter (40) is not coupled to an operational amplifier (47, 69) that is recovering from operation in slew rate limit mode.

21 Claims, 5 Drawing Sheets

FIG. 1 —PRIOR ART—

GLITCHLESS SWITCHED-CAPACITOR BIQUAD LOW PASS FILTER

FIELD OF THE INVENTION

This invention relates generally to switched-capacitors, and more particularly, to a glitchless switched-capacitor biquad low pass filter.

BACKGROUND OF THE INVENTION

Switched-capacitors are commonly used to approximate resistors in signal processing integrated circuits. Using switched-capacitors as resistors provides several advantages. For example, switched-capacitors generally require less surface area on an integrated circuit than a resistor having an equivalent value, and switched-capacitors provide greater accuracy than resistors. The greater accuracy is possible since the resistance of the switched-capacitor circuits depends on the ratio of the capacitance values, and not on the actual sizes of the capacitors.

In filter circuits using switched-capacitors, a clock is used to provide nonoverlapping clock signals to control the sampling of an input signal. The sampling frequency should be much greater than the frequency of the sampled input signal, and the capacitors of the filter circuit, including any parasitic capacitance, are charged and discharged at the appropriate switching time. During recharging of the capacitors, the output signal of the filter may not be at the required voltage. If the output signal is used as a continuous time output, then the output signal is in error during the time it is settling. This error may appear as a "glitch" on the output signal. If the input signal is over-sampled, the average error, or glitch, from recharging the capacitors, can be significant.

FIG. 1 illustrates in schematic diagram form, prior art switched-capacitor biquad filter 10. Switched-capacitor biquad filter 10 includes first stage 11, second stage 20, and feedback switch 33. First stage 11 includes operational amplifier 12, switches 13, 15, and 16, and capacitors 14 and 17. Second stage 20 includes switched-capacitor circuit 21, operational amplifier 28, switches 30 and 31, and capacitors 29 and 32. Switched-capacitor circuit 21 includes switches 22, 24, 26, and 27, and capacitor 23. Switches 16, 22, 27, and 31 receive a clock signal labeled "$\phi 1$", and switches 13, 15, 26, 24, and 30 receive a clock signal labeled "$\phi 2$". Clock signals $\phi 1$ and $\phi 2$ are out-of-phase non-overlapping clock signals, such that when $\phi 1$ is active, $\phi 2$ is inactive. Note that a fully differential configuration of switched-capacitor biquad filter 10 may be constructed by replacing operational amplifiers 12 and 28 with operational amplifiers having differential input terminals and differential output terminals, and repeating the other circuitry shown in FIG. 1.

Switch 13 has an input terminal for receiving an input signal labeled "$V_{IN}$", and an output terminal connected to capacitor 14. Switch 16 and capacitor 17 are connected in series between an input terminal and an output terminal of operational amplifier 12. Switch 15 provides an auto-zero function for switched-capacitor biquad filter 10 which increases steady state accuracy.

Switched-capacitor biquad filter 10 functions as a unity gain low pass filter, with a very precise unity gain transfer function. Switched-capacitor biquad filter 10 has a precise unity gain transfer function because capacitor 14 senses both the input signal $V_{IN}$, and the output signal $V_{OUT}$ through a feedback signal path to the first plate electrode of capacitor 14. This eliminates matching errors and provides a DC transfer function that is exactly unity.

The problem with switched-capacitor biquad filter 10 occurs when output signal $V_{OUT}$ is sensed in continuous time. When a continuous time output is required, output signal $V_{OUT}$ is best described in the Laplace (s) domain instead of the discrete time (z) domain. Any non-linear movement of output signal $V_{OUT}$, which is correlated with the input signal $V_{IN}$, causes distortion in output signal $V_{OUT}$. When switch 31 is open, a charge may accumulate on the parasitic capacitance of the common node between switch 31, capacitor 29, and switch 30. When switch 31 is closed, the parasitic capacitance is discharged to $V_{AG}$. When switch 31 reopens and switch 30 closes, operational amplifier 28 must recharge the parasitic capacitance. Charging of the parasitic capacitance by operational amplifier 28 causes operational amplifier 28 to slew rate limit. Slew rate limit is a non-linear effect and therefore causes distortion.

Any parasitic capacitance coupled to the output terminal of operational amplifier 12 is discharged to $V_{AG}$ when switch 15 is closed. Operational amplifier 12 also slew rate limits when it charges the parasitic capacitance coupled to its output terminal. When switch 15 is open, switches 16 and 33 are closed, thus coupling the output terminal of operational amplifier 28 to the output terminal of operational amplifier 12 via capacitor 17, switch 16, capacitor 14 and switch 33. Output signal $V_{OUT}$ is adversely affected by the nonlinear recovery of operational amplifier 12, which causes distortion in output signal $V_{OUT}$.

SUMMARY OF THE INVENTION

Accordingly, there is provided, in one form, a switched-capacitor biquad low pass filter including a differential switched-capacitor integrator, a differential lossy switched-capacitor integrator, a feedback circuit, and first and second common-mode circuits. The differential switched-capacitor integrator receives first and second input signals at first and second input nodes. In response to a first clock signal being active, the differential switched-capacitor integrator provides first and second intermediate signals at first and second intermediate nodes. The differential lossy switched-capacitor integrator is coupled to the first and second intermediate nodes, and receives the first and second intermediate signals. In response to a second clock signal being active, the differential lossy switched-capacitor integrator provides first and second output signals at first and second output nodes. The feedback circuit couples the first and second input nodes to the first and second output nodes in response to a third clock signal becoming active. The third clock signal is generated from the first clock signal and becomes active a predetermined time after the first clock signal becomes active. The first common-mode circuit is coupled to the first and second intermediate nodes, and controls a common-mode voltage between the first and second intermediate nodes. The second common-mode circuit is coupled to the first and second output nodes, and controls a common-mode voltage between the first and second intermediate nodes. These and other features and advantages will be more clearly understood from the following detailed description taken in conjunction with the accompanying drawings.

DESCRIPTION OF A PREFERRED EMBODIMENT

Generally, the present invention provides a glitchless switched-capacitor biquad low pass filter. Glitchless operation is accomplished by insuring that the output of the switched-capacitor biquad low pass filter is not affected by an operational amplifier of the switched-capacitor biquad low pass filter that is in slew rate limit mode. Keeping the output signal of the switched-capacitor biquad low pass filters, illustrated of FIG. 2 and FIG. 3, from being affected by an operational amplifier which is in slew rate limit mode is accomplished by preventing the operational amplifiers from operating in slew rate limit mode, or by adjusting the clock signals such that the output of the switched-capacitor biquad low pass filter is not coupled to an operational amplifier that is recovering from operation in slew rate limit mode.

Figure 2:
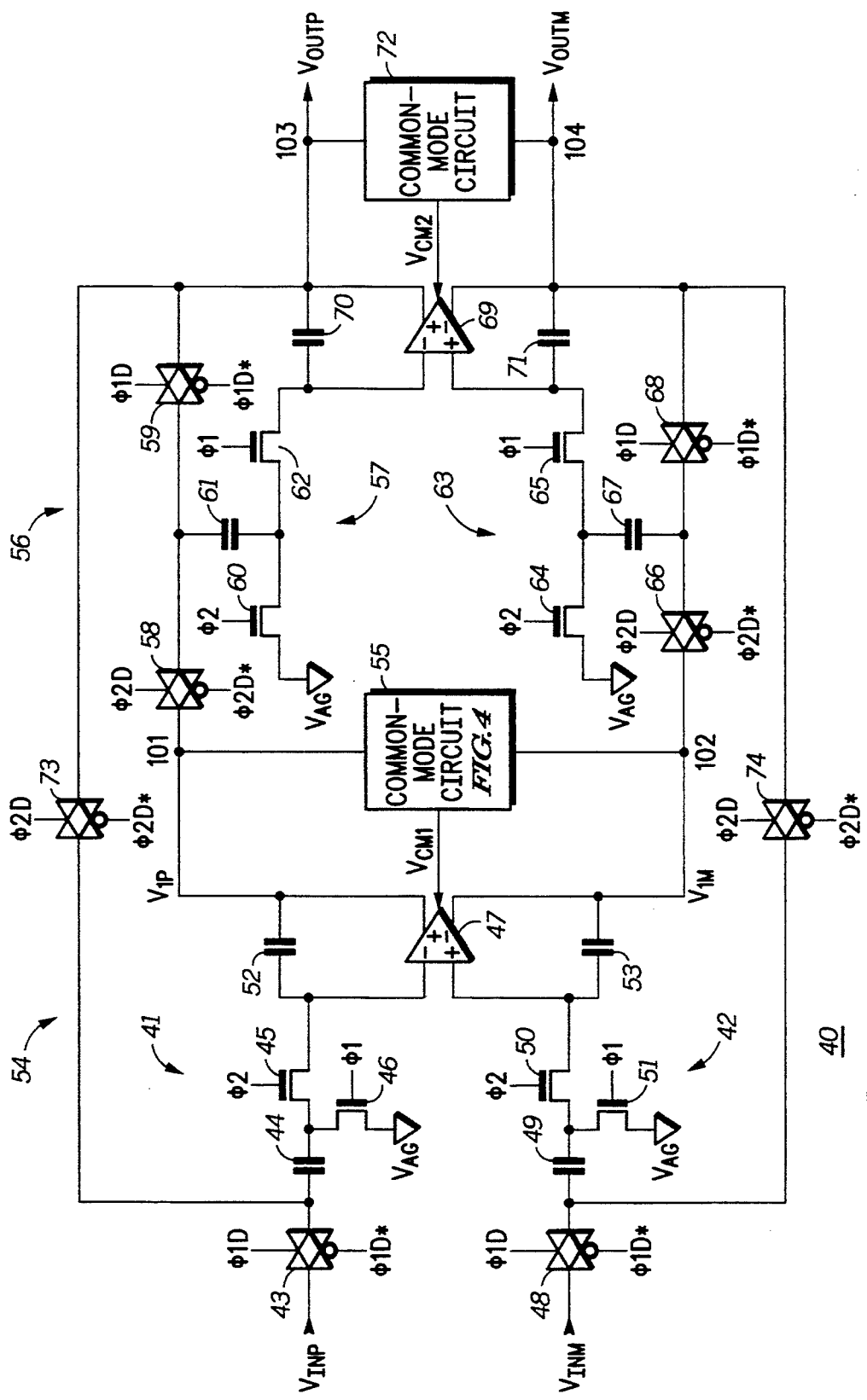
FIG. 2 illustrates in partial schematic diagram form and partial block diagram form, a switched-capacitor biquad low pass filter in accordance with one embodiment of the present invention.

The present invention can be more fully described with reference to FIG. 2–FIG. 5. FIG. 2 illustrates in partial schematic diagram form and partial block diagram form, fully differential switched-capacitor biquad low pass filter 40 in accordance with one embodiment of the present invention. Filter 40 includes first stage 54, second stage 56, and feedback transmission gates 73 and 74. First stage 54 includes switched-capacitors 41 and 42, operational amplifier 47, feedback capacitors 52 and 53, and common-mode circuit 55. Second stage 56 includes switched-capacitors 57 and 63, operational amplifier 69, feedback capacitors 70 and 71, and common-mode circuit 72. Switched-capacitor 41 includes transmission gate 43, capacitor 44, and N-channel transistors 45 and 46. Switched-capacitor 42 includes transmission gate 48, capacitor 49, and N-channel transistors 50 and 51. Switched-capacitor 57 includes transmission gates 58 and 59, capacitor 61, and N-channel transistors 60 and 62. Switched-capacitor 63 includes transmission gates 66 and 68, capacitor 67, and N-channel transistors 64 and 65. Operational amplifiers 47 and 69 are conventional, fully differential, operational amplifiers. Each of the transmission gates are complementary metal-oxide semiconductor (CMOS) transmission gates. It should be apparent, however, that the transmission gates and the N-channel transistors shown in FIG. 2 function as switching elements and many different circuit elements may be substituted therefor.

In switched-capacitor 41, transmission gate 43 has a first terminal for receiving an input signal labeled "$V_{INP}$", control terminals for receiving complementary clock signals $\phi 1D$ and $\phi 1D^*$, and a second terminal. Note that an asterisk (*) after a signal name indicates that the signal is a logical complement of a signal having the same name but lacking the asterisk (*). Capacitor 44 has a first plate electrode connected to the second terminal of transmission gate 43, and a second plate electrode. N-channel transistor 45 has a first source/drain electrode connected to the second plate electrode of capacitor 44, a gate for receiving clock signal $\phi 2$, and a second source/drain electrode. N-channel transistor 46 has a drain connected to the second plate electrode of capacitor 44, a gate for receiving clock signal $\phi 1$, and a source connected to a reference voltage terminal labeled "$V_{AG}$". For maximum signal swing, reference voltage $V_{AG}$ is generally provided at about the midpoint, or one-half the magnitude of the signal swing.

In switched-capacitor 42, transmission gate 48 has a first terminal for receiving an input signal labeled "$V_{INM}$", control terminals for receiving complementary clock signals $\phi 1D$ and $\phi 1D^*$, and a second terminal. Capacitor 49 has a first plate electrode connected to the second terminal of transmission gate 48, and a second plate electrode. N-channel transistor 50 has a first source/drain electrode connected to the second plate electrode of capacitor 49, a gate for receiving clock signal $\phi 2$, and a second source/drain electrode. N-channel transistor 51 has a drain connected to the second plate electrode of capacitor 49, a gate for receiving clock signal $\phi 1$, and a source connected to reference voltage terminal $V_{AG}$.

Operational amplifier 47 has an inverting input terminal connected to the second source/drain electrode of N-channel transistor 45, a noninverting input terminal connected to the second source/drain electrode of N-channel transistor 50, a noninverting output terminal connected to node 101 for providing a signal labeled "$V_{1P}$", and an inverting output terminal connected to node 102 for providing a signal labeled "$V_{1M}$". Capacitor 52 has a first plate electrode connected to the inverting input terminal of operational amplifier 47, and a second plate electrode connected to the noninverting output terminal of operational amplifier 47. Capacitor 53 has a first plate electrode connected to the noninverting input terminal of operational amplifier 47, and a second plate electrode connected to the inverting output terminal of operational amplifier 47.

In switched-capacitor 57, transmission gate 58 has a first terminal connected to node 101, control terminals for receiving clock signals $\phi 2D$ and $\phi 2D^*$, and a second terminal. Transmission gate 59 has a first terminal connected to the second terminal of transmission gate 58, control terminals for receiving clocks signals $\phi 1D$ and $\phi 1D^*$, and a second terminal. Capacitor 61 has a first plate electrode connected to the second terminal of transmission gate 58, and a second plate electrode. N-channel transistor 60 has a first source/drain electrode connected to reference voltage terminal $V_{AG}$, a control electrode for receiving clock signal $\phi 2$, and a second source/drain electrode connected to the second plate electrode of capacitor 61. N-channel transistor 62 has a first source/drain electrode connected to the second plate electrode of capacitor 61, a control electrode for receiving clock signal $\phi 1$, and a second source/drain electrode. Switched-capacitor 63 is connected in the same manner as switched-capacitor 57.

Operational amplifier 69 has an inverting input terminal connected to the second source/drain electrode of N-channel transistor 62, a noninverting input terminal connected to the second source/drain electrode of N- channel transistor 65, a noninverting output terminal connected to node 103 for providing an output signal labeled "$V_{OUTP}$", and an inverting output terminal connected to node 104 for providing an output signal labeled "$V_{OUTM}$". Capacitor 70 has a first plate electrode connected to the inverting input terminal of operational amplifier 69, and a second plate electrode connected to the noninverting output terminal of operational amplifier 59. Capacitor 71 has a first plate electrode connected to the noninverting input terminal of operational amplifier 69, and a second plate electrode connected to the inverting output terminal of operational amplifier 69.

Common-mode circuit 55 has a first input terminal connected to node 101, a second input terminal connected to node 102, and an output terminal connected to a common-mode terminal of operational amplifier 47 for providing a common-mode voltage labeled "$V_{CM1}$". Common-mode circuit 55 is illustrated in more detail in FIG. 4. Common-mode circuit 72 has a first input terminal connected to node 103, a second input terminal connected to node 104, and an output terminal connected to a common-mode terminal of operational amplifier 69 for providing a common-mode voltage labeled "$V_{CM2}$". The circuitry of common-mode circuit 72 is the same as the circuitry of common-mode circuit 55.

Feedback transmission gate 73 has a first terminal connected to node 103, control terminals for receiving clock signals $\phi 2D$ and $\phi 2D^*$, and a second terminal connected to the first plate electrode of capacitor 44. Feedback transmission gate 74 has a first terminal connected to node 104, control terminals for receiving clock signals $\phi 2D$ and $\phi 2D^*$, and a second terminal connected to the first plate electrode of capacitor 49.

The signal path throughout filter 40 is fully differential. This results in reduced injection of the power supply and clock-related signals into the signal path, and also increases dynamic range, since the effective signal swing is doubled.

Filter 40 is a unity gain glitchless switched-capacitor biquad low pass filter. Like prior art filter 10, capacitors 44 and 49 of filter 40 insures unity gain. However, unlike prior art filter 10, there is not an autozero switch connected to capacitors 44 and 49 to cause operational amplifier 47 to slew rate limit. Also, the voltage change across capacitors 61 and 67 is relatively small during any one clock cycle. This relatively small voltage change per clock cycle allows operational amplifier 69 to operate without going into slew rate limit mode. Preventing operational amplifiers 47 and 69 from operating in slew rate limit mode provides nearly glitchless operation of filter 40.

Figure 4:
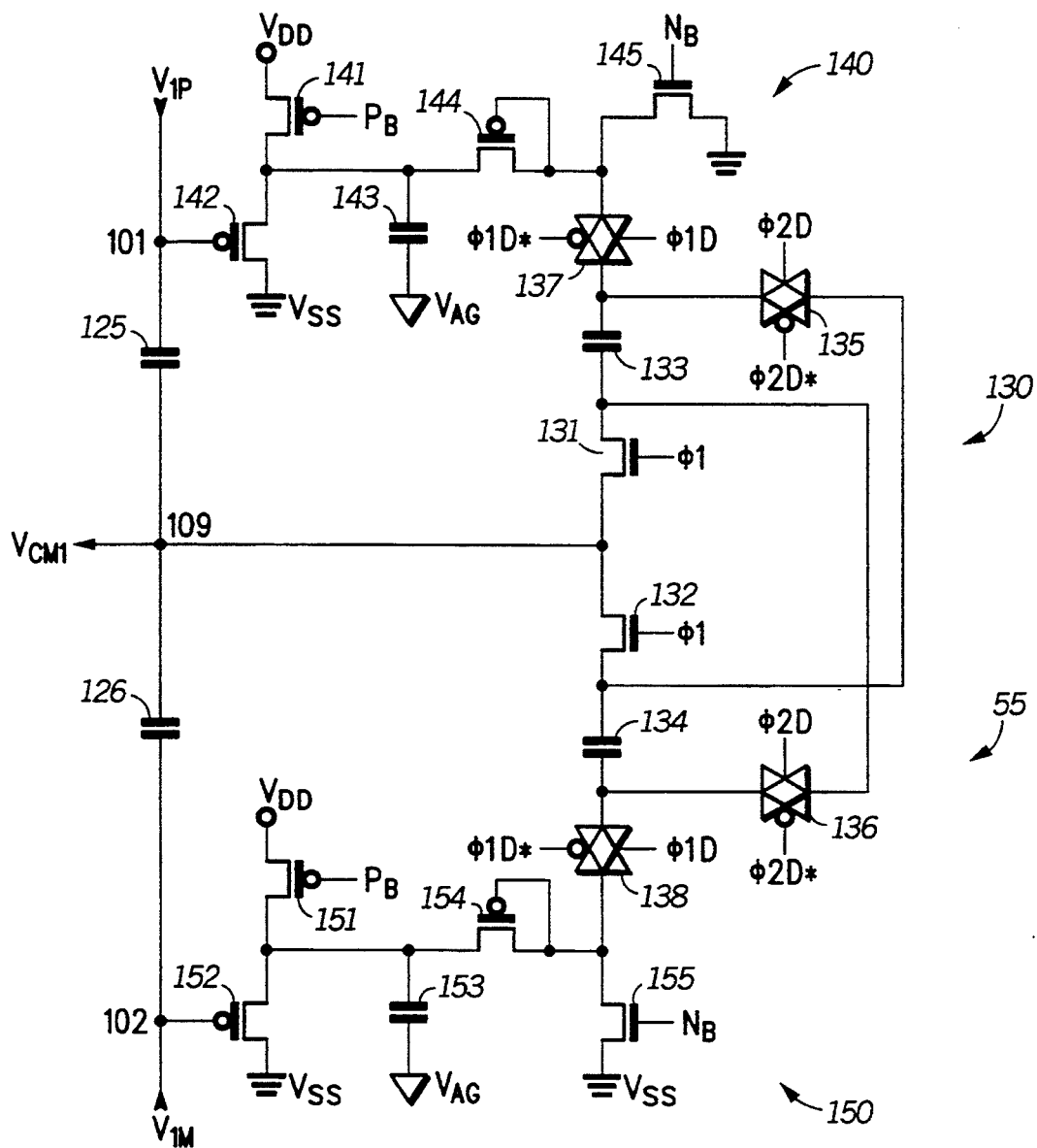
FIG. 4 illustrates in schematic diagram form, the common-mode circuit illustrated in FIG. 2.
Figure 5:
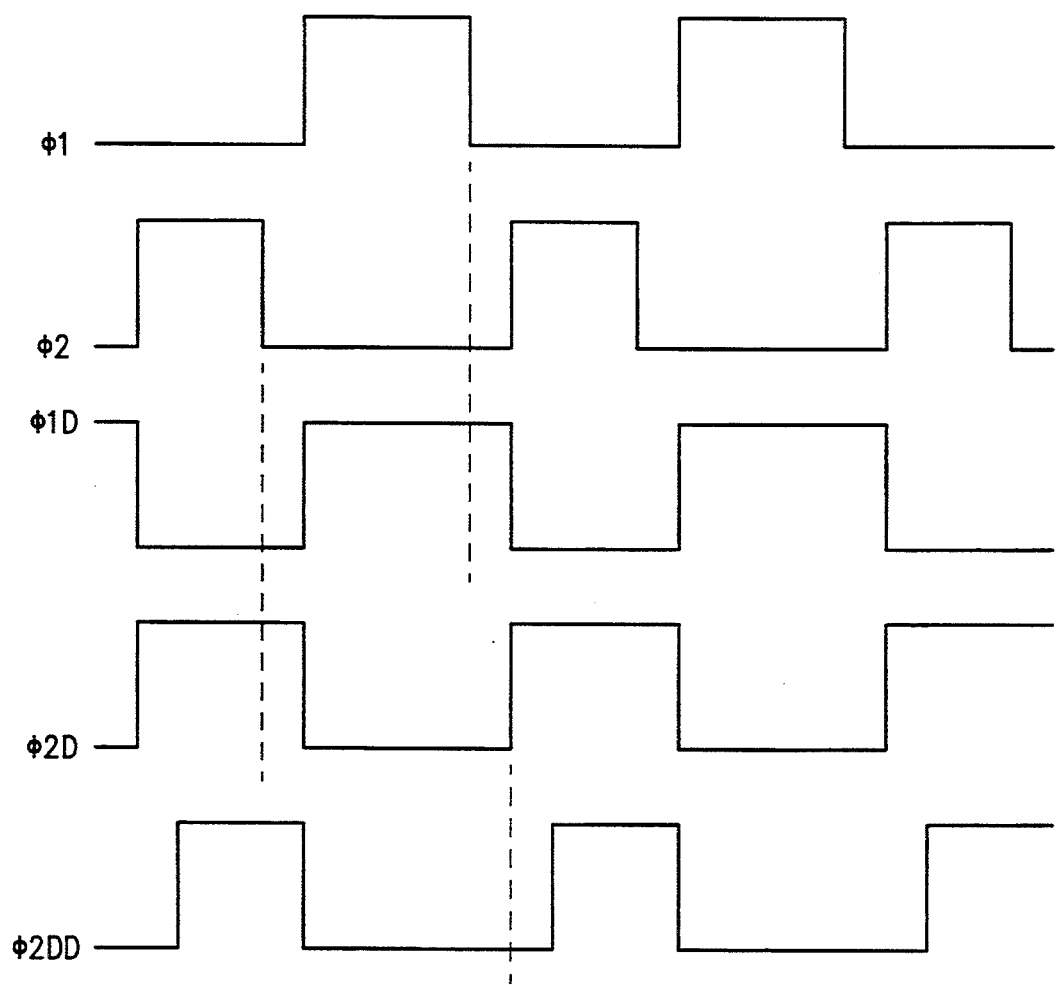
FIG. 5 illustrates a waveform of the non-overlapping clock signals used in the embodiment of FIG. 2 and FIG. 3.

First stage 54 of filter 40 is a differential switched-capacitor integrator. Common-mode circuit 55 controls a common-mode output voltage of first stage 54. First stage 54 creates a first pole at zero hertz in a forward gain path. Signals $V_{1P}$ and $V_{1M}$ are output signals of first stage 54 which are provided to second stage 56. Second stage 56 is a differential lossy switched-capacitor integrator. Common-mode circuit 72 controls a common-mode output voltage of second stage 56. In a preferred embodiment, common-mode circuits 55 and 72 use the same circuit, which is illustrated in FIG. 4. However, in other embodiments, other common-mode circuits may be used, such as voltage dividers using resistors. Second stage 56 provides a second forward gain pole of the filter 40. The feedback path is formed by transmission gates 73 and 74 and capacitors 44 and 49. The feedback path establishes the unity gain in a passband and moves the first pole off of zero hertz. The waveforms of the clock signals used in filter 40 are illustrated in FIG. 5, and will be discussed later.

Figure 3:
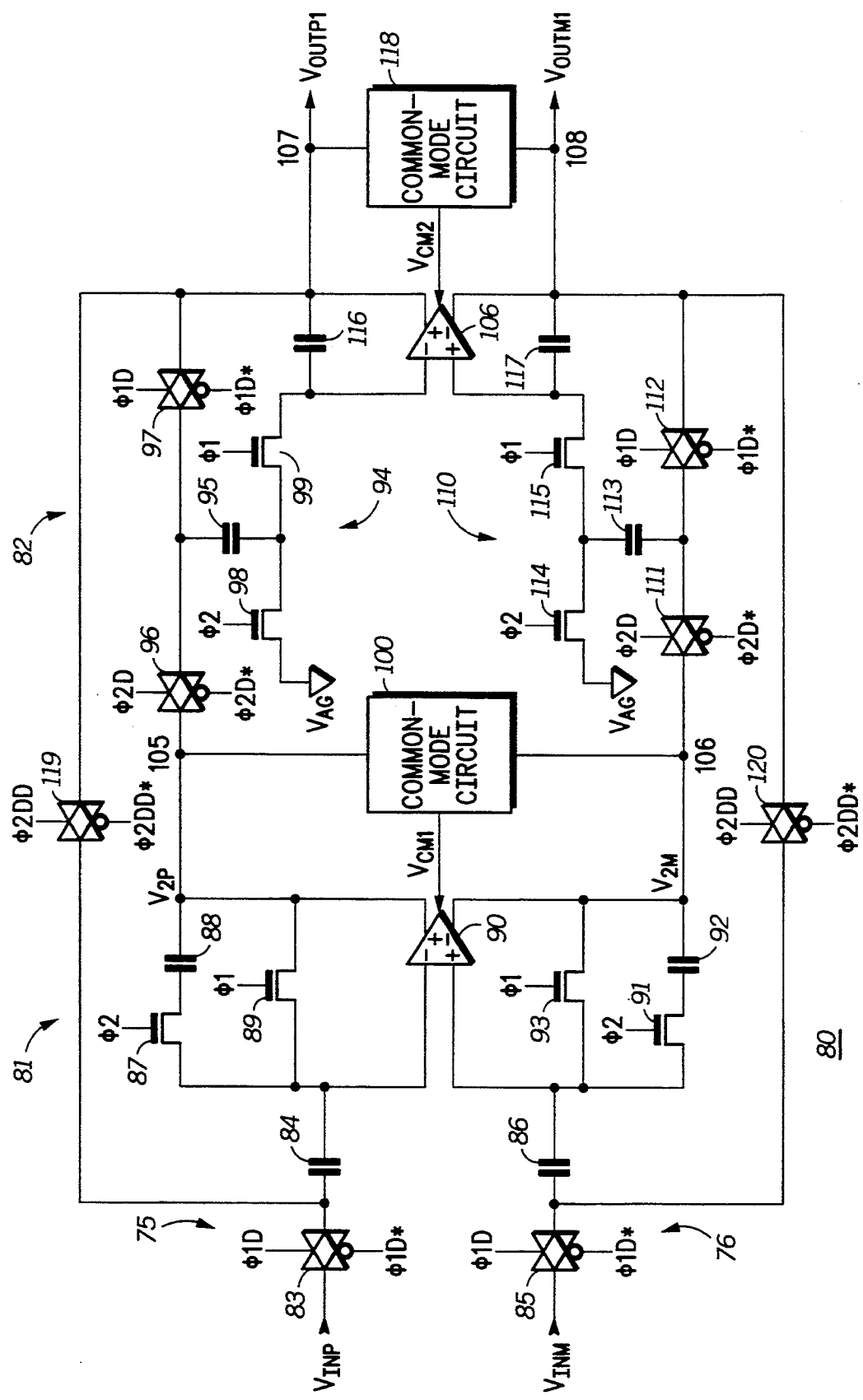
FIG. 3 illustrates in partial schematic diagram form and partial block diagram form, a switched-capacitor biquad low pass filter in accordance with another embodiment of the present invention.

FIG. 3 illustrates in partial schematic diagram form and partial block diagram form, switched-capacitor biquad low pass filter 80 in accordance with another embodiment of the present invention. Filter 80 includes first stage 81, second stage 82, and feedback transmission gates 119 and 120. First stage 81 includes switched-capacitors 75 and 76, operational amplifier 90, capacitors 88 and 92, N-channel transistors 87, 89, 91, and 93 and common-mode circuit 100. Second stage 82 includes switched-capacitors 94 and 110, operational amplifier 106, feedback capacitors 116 and 117, and common-mode circuit 118. Switched-capacitor 75 includes transmission gate 83 and capacitor 84. Switched-capacitor 76 includes transmission gate 85 and capacitor 86. Switched-capacitor 94 includes transmission gates 96 and 97, capacitor 95, and N-channel transistors 98 and 99. Switched-capacitor 110 includes transmission gates 111 and 112, capacitor 113, and N-channel transistors 114 and 115.

In first stage 81, transmission gate 83 has a first terminal for receiving input signal $V_{INP}$, control terminals for receiving clocks signals $\phi 1D$ and $\phi 1D^*$, and a second terminal. Capacitor 84 has a first plate electrode connected to the second terminal of transmission gate 83, and a second terminal. Transmission gate 85 has a first terminal for receiving input signal $V_{INM}$, control terminals for receiving clocks signals $\phi 1D$ and $\phi 1D^*$, and a second terminal. Capacitor 86 has a first plate electrode connected to the second terminal of transmission gate 85, and a second plate electrode. Operational amplifier 90 has an inverting input terminal connected to the second plate electrode of capacitor 84, a noninverting input terminal connected to the second plate electrode of capacitor 86, a noninverting output terminal connected to node 105 for providing a signal labeled "$V_{2P}$", and an inverting output terminal connected to node 106 for providing a signal labeled "$V_{2M}$". N-channel transistor 89 has a first source/drain electrode connected to the inverting input terminal of operational amplifier 90, a gate for receiving clock signal $\phi 1$, and a second source/drain electrode connected to the noninverting output terminal of operational amplifier 90. N-channel transistor 93 has a first source/drain electrode connected to the noninverting input terminal of operational amplifier 90, a gate for receiving clock signal $\phi 1$, and a second source/drain electrode connected to the inverting output terminal of operational amplifier 90. N-channel transistor 87 has a first source/drain electrode connected to the inverting input terminal of operational amplifier 90, a gate for receiving clock signal $\phi 2$, and a second source/drain electrode. Capacitor 88 has a first plate electrode connected to the second source/drain electrode of N-channel transistor 87, and a second plate electrode connected to the noninverting output terminal of operational amplifier 90. N-channel transistor 91 has a first source/drain electrode connected to the inverting input terminal of operational amplifier 90, a gate for receiving clock signal $\phi 2$, and a second source/drain electrode. Capacitor 92 has a first plate electrode connected to the second source/drain electrode of N-channel transistor 91, and a second plate electrode connected to the second output terminal of operational amplifier 90. Common-mode circuit 100 has a first input terminal connected to node 105, a second input terminal connected to node 106, and an output terminal connected to a common-mode terminal of operational amplifier 90 for providing a common-mode voltage labeled "$V_{CM1}$". Common-mode circuit 100 is substantially the same as common-mode circuit 55, which is illustrated in detail in FIG. 4.

In second stage 82, Transmission gate 96 has a first terminal connected to the first output terminal of operational amplifier 90, control terminals for receiving clocks signals $\phi 2D$ and $\phi 2D^*$, and a second terminal. Transmission gate 97 has a first terminal connected to the second terminal of transmission gate 96, control terminals for receiving clocks signals $\phi 1D$ and $\phi 1D^*$, and a second terminal. Capacitor 95 has a first plate electrode connected to the second terminal of transmission gate 96, and a second plate electrode. N-channel transistor 98 has a first source/drain electrode connected to reference voltage terminal $V_{AG}$, and a second source/drain electrode connected to the second plate electrode of capacitor 95. N-channel transistor 99 has a first source/drain electrode connected to the second plate electrode of capacitor 95, and a second source/drain electrode. Transmission gate 111 has a first terminal connected to the inverting output terminal of operational amplifier 90, and a second terminal. Transmission gate 112 has a first terminal connected to the second terminal of transmission gate 111, control terminals for receiving clocks signals $\phi 1D$ and $\phi 1D^*$, and a second terminal. Capacitor 113 has a first plate electrode connected to the second terminal of transmission gate 111, and a second terminal. N-channel transistor 114 has a first source/drain electrode connected to reference voltage terminal $V_{AG}$, a gate for receiving clock signal $\phi 2$, and a second source/drain electrode connected to the second plate electrode of capacitor 113. N-channel transistor 115 has a first source/drain electrode connected to the second plate electrode of capacitor 113, a gate for receiving clock signal $\phi 1$, and a second source/drain electrode. Operational amplifier 106 has an inverting input terminal connected to the second source/drain electrode of N-channel transistor 99, a noninverting input terminal connected to the second source/drain electrode of N-channel transistor 115, a noninverting output terminal connected to node 107 for providing an output signal labeled "$V_{OUTP1}$", and an inverting output terminal connected to node 108 for providing an output signal labeled "$V_{OUTM1}$". Capacitor 116 has a first plate electrode connected to the inverting input terminal of operational amplifier 106, and a second plate electrode connected to the noninverting output terminal of operational amplifier 116. Capacitor 117 has a first plate electrode connected to the noninverting input terminal of operational amplifier 106, and a second plate electrode connected to the inverting output terminal of operational amplifier 106. Common-mode circuit 118 has a first input terminal connected to node 107, a second input terminal connected to node 108, and an output terminal connected to a common-mode terminal of operational amplifier 106 for providing a common-mode voltage labeled "$V_{CM2}$". Common-mode circuit 118 is substantially the same as common-mode circuit 55, which is illustrated in detail in FIG. 4. Feedback transmission gate 119 has a first terminal connected to node 107, a second terminal connected to the second terminal of transmission gate 83, and control terminals for receiving differential clock signals labeled "$\phi 2DD$" and "$\phi 2DD^*$". Feedback transmission gate 120 has a first terminal connected to node 108, a second terminal connected to the second terminal of transmission gate 85, and control terminals for receiving clock signals $\phi 2DD$ and $\phi b2DD^*$.

Filter 80 is a differential switched-capacitor unity gain offset compensated low pass filter. First stage 81 is a differential switched-capacitor integrator. Common-mode circuit 100 controls the common-mode voltage of operational amplifier 90. First stage 81 creates a first pole at zero hertz in the forward gain path of filter 80. An auto-zero network is formed by N-channel transistors 87 and 89, capacitor 84, transmission gate 83, and operational amplifier 90. Another auto-zero network is formed by N-channel transistors 91 and 93, capacitor 86, and transmission gate 85. The purpose of the auto-zero networks is to remove a differential offset voltage of operational amplifier 90. Output signals $V_{2P}$ and $V_{2M}$ are provided to second stage 82. Second stage 82 is a differential lossy switched-capacitor integrator. The purpose of second stage 82 is to create a second forward gain pole. A differential feedback path is formed by transmission gates 119 and 120, and capacitors 84 and 86. The purpose of the feedback path is to create unity gain in the passband and move the first pole from zero hertz to a different frequency. Where the first pole is moved depends on the particular application.

Delayed clock signal $\phi 2DD$ and $\phi 2DD^*$ is provided to feedback transmission gates 119 and 120 to insure that output signals $V_{OUTP1}$ and $V_{OUTM1}$ are not adversely affected by the output of operational amplifier 90 if operational amplifier 90 is in slew rate limit mode. During normal operation, the voltage change during each clock cycle across capacitors 95 and 113 is relatively small to insure that operational amplifier 106 does not operate in slew rate limit mode.

FIG. 4 illustrates in schematic diagram form, common-mode circuit 55 of FIG. 2. Common-mode circuit 55 includes capacitors 125 and 126, switched-capacitor circuit 130, and common-mode buffer circuits 140 and 150. Switched-capacitor circuit 130 includes N-channel transistors 131 and 132, capacitors 133 and 134, and transmission gates 135, 136, 137, and 138. Common-mode buffer circuit 140 includes N-channel transistor 145, P-channel transistors 141, 142, and 144, and capacitor 143. Common-mode buffer circuit 150 includes N-channel transistor 155, P-channel transistors 151, 152, and 154, and capacitor 153.

Capacitor 125 has a first plate electrode connected to node 101 for receiving signal $V_{1P}$, and a second plate electrode connected to node 109 for providing common-mode voltage $V_{CM1}$. Capacitor 126 has a first plate electrode connected to node 102 for receiving signal $V_{1M}$, and a second plate electrode connected to the second plate electrode of capacitor 125 at node 109. N-channel transistor 131 has a first source/drain electrode connected to node 109, a gate for receiving clock signal $\phi 1$, and a second source/drain electrode. N-channel transistor 132 has a first source/drain electrode connected to node 109, a gate for receiving clock signal $\phi 1$, and a second source/drain electrode. Capacitor 133 has a first plate electrode connected to the second source/drain electrode of N-channel transistor 131, and a second plate electrode. Capacitor 134 has a first plate electrode connected to the second source/drain electrode of N-channel transistor 132, and a second plate electrode. Transmission gate 135 has a first terminal connected to the Second plate electrode of capacitor 133, control terminals for receiving clock signals $\phi 2D$ and $\phi 2D^*$, and a second terminal connected to the second source/drain electrode of N-channel transistor 132. Transmission gate 136 has a first terminal connected to the second plate electrode of capacitor 134, control terminals for receiving clock signals $\phi2D$ and $\phi2D^*$, and a second terminal connected to the second source/drain electrode of N-channel transistor 131. Transmission gate 137 has a first terminal connected second plate electrode of capacitor 133, control terminals for receiving clock signals $\phi1D$ and $\phi1D^*$, and a second terminal. Transmission gate 138 has a first terminal connected to the second plate electrode of capacitor 134, control terminals for receiving clock signals $\phi1D$ and $\phi1D^*$, and a second terminal. N-channel transistor 145 has a drain connected to the second terminal of transmission gate 137, a gate for receiving a bias voltage labeled "$N_B$", and a source electrode connected to a power supply voltage terminal labeled "$V_{SS}$". P-channel transistor 141 has a source connected to power supply voltage terminal $V_{DD}$, a gate for receiving bias voltage $P_B$, and a drain. P-channel transistor 142 has source connected to the drain of P-channel transistor 141, a gate connected to the second plate electrode of capacitor 125 at node 101, and a drain connected to $V_{SS}$. Capacitor 143 has a first plate electrode connected to the source of P-channel transistor 142, and a second plate electrode connected to $V_{AG}$. P-channel transistor 144 has a first source/drain electrode connected to the first plate electrode of capacitor 143, and both a second source/drain electrode and a gate connected to the drain of N-channel transistor 145. N-channel transistor 155 has a drain connected to the second terminal of transmission gate 138, a gate for receiving bias voltage $N_B$, and a source connected to power supply voltage terminal $V_{SS}$. P-channel transistor 151 has a source connected to a power supply voltage terminal labeled "$V_{DD}$", a gate for receiving a bias voltage labeled "$P_B$", and a drain. P-channel transistor 152 has source connected to the drain of P-channel transistor 151, a gate connected to the second plate electrode of capacitor 126 at node 102, and a drain connected to $V_{SS}$. Capacitor 153 has a first plate electrode connected to the source of P-channel transistor 152, and a second plate electrode connected to $V_{AG}$. P-channel transistor 154 has a first source/drain electrode connected to the first plate electrode of capacitor 153, and both a second source/drain electrode and a gate connected to the drain of N-channel transistor 155. Power supply voltage terminal $V_{DD}$ receives a positive power supply voltage and power supply voltage terminal $V_{SS}$ is connected to ground potential. However, in other embodiments, $V_{DD}$ may be connected to ground potential, with $V_{SS}$ receiving to a negative power supply voltage.

Switched-capacitor circuit 130 senses the common-mode voltage between signals $V_{1P}$ and $V_{1M}$, and provides this voltage to node 109 as common-mode voltage $V_{CM1}$ during the time clock signal $\phi1$ is active. To prevent capacitors 125 and 126 from storing any offset voltage that exists between nodes 101 and 102, capacitors 133 and 134 discharge any initial offset in capacitors 125 and 126 when clock signal $\phi1$ is active. Switched-capacitor circuit 130 is preferred over conventional resistor voltage dividers, because switched-capacitor circuit 130 draws no common-mode current, is more accurate, and requires less surface area of an integrated circuit.

Buffers 140 and 150 include source followers. The purpose of buffers 140 and 150 is to isolate any clock glitches, or transients, that may be created by switched-capacitor circuit 130 from causing errors in signals $V_{1P}$ and $V_{1M}$ at nodes 101 and 102 of filter 40 and in signals $V_{2P}$ and $V_{2M}$ at nodes 105 and 106 of filter 80.

FIG. 5 illustrates waveforms of the non-overlapping clock signals used in the embodiments of FIG. 2 and FIG. 3. The clock signals are active at the times when they are indicated as logic high signals. (Note that the waveforms illustrated in FIG. 5 are not drawn to scale.) Referring to FIG. 5, clock signals $\phi1$ and $\phi2$ are non-overlapping clock signals that are 180 degrees out of phase. Clock signal $\phi1D$ is generated from clock signal $\phi1$. The falling edge of clock signal $\phi1D$ falls after the falling edge of clock signal $\phi1$, and the rising edge of clock signal $\phi1D$ is coincident with the rising edge of clock signal $\phi1$. Clock signal $\phi2D$ is generated from clock signal $\phi2$. The falling edge of clock signal $\phi2D$ falls after the falling edge of clock signal $\phi2$, and the rising edge of clock signal $\phi2D$ is coincident with the rising edge of clock signal $\phi2$. Clock signal $\phi2DD$ is generated from clock signal $\phi2D$. Clock signal $\phi2DD$ is used in filter 80 of FIG. 3 to control transmission gates 119 and 120. Note that clock signal $\phi2DD$ is not used with filter 40. Filter 40 does not need clock signal $\phi2DD$ to control feedback transmission gates 73 and 74 because first stage 54 does not have an autozero circuit coupled to nodes 101 and 102. The rising edge of clock signal $\phi2DD$ occurs a predetermined time after the rising edge of clock signal $\phi2D$, and the falling edge of clock signal $\phi2DD$ should be coincident with the falling edge of clock signal $\phi2D$. The length of the predetermined time delay between the rising edge of clock signal $\phi2DD$ and the rising edge of $\phi2D$ depends on how quickly signals $V_{2P}$ and $V_{2M}$, at nodes 105 and 106, respectively, can settle after clock signal $\phi2$ rises.

Clock signal $\phi1^*$ is the logical complement of clock signal $\phi1$, clock signal $\phi2^*$ is the logical complement of clock signal $\phi2$, clock signal $\phi1D^*$ is the logical complement of $\phi1D$, clock signal $\phi2D^*$ is the logical complement of clock signal $\phi2D$, and clock signal $\phi2DD^*$ is the logical complement of clock signal $\phi2DD$. The complementary clock signals are not shown in FIG. 5, for the purposes of simplicity and clarity.

Figure 1:
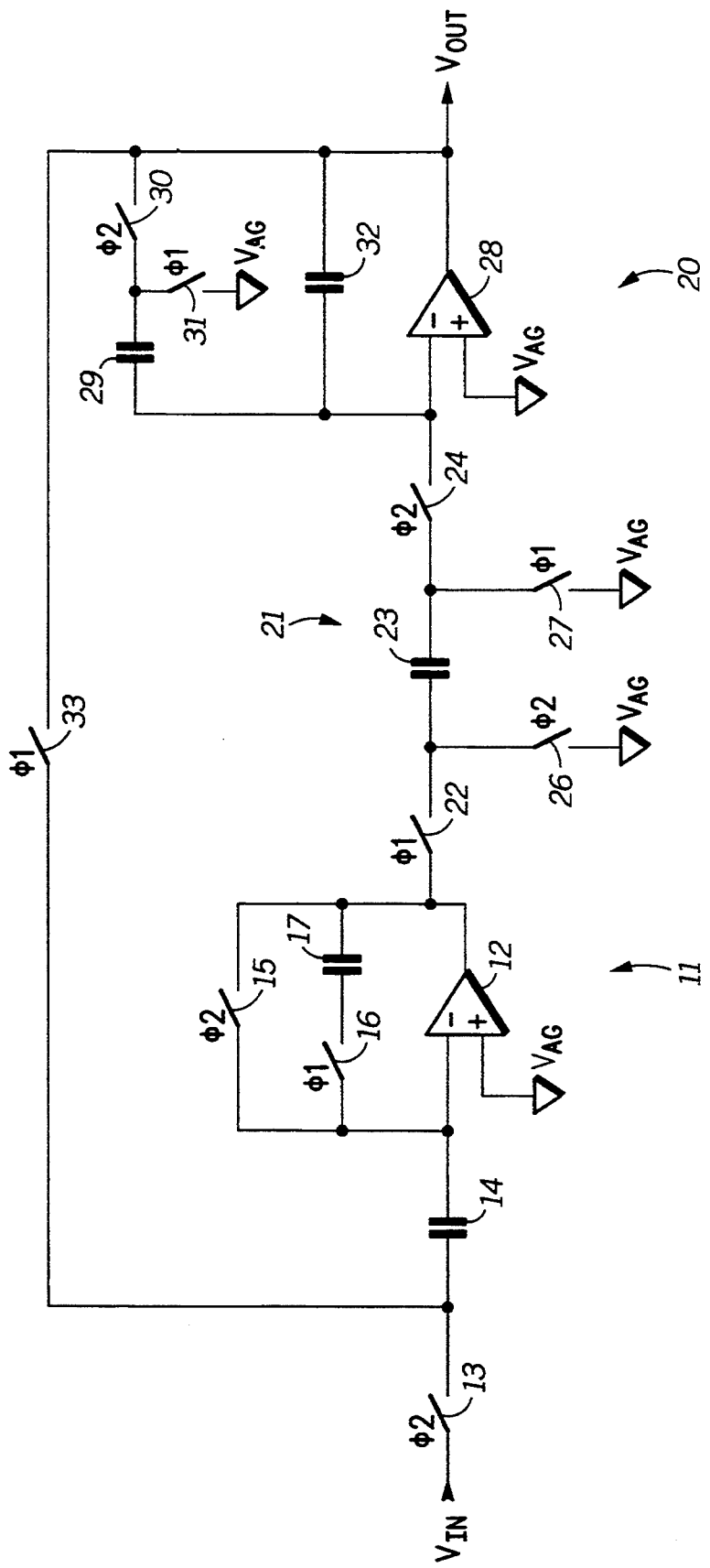
FIG. 1 illustrates in schematic diagram form, a prior art switched-capacitor biquad filter.

As discussed above, the problem with the prior art filter 10 of FIG. 1 is that output signal $V_{OUT}$ is affected by slew rate limit transitions of operational amplifiers 12 and 28. The slew-rate limit transitions result in distortion in output signal $V_{OUT}$. Filter 40 of FIG. 2 and filter 80 of FIG. 3 solve the problem with slew rate limit transitions in the operational amplifiers. Output signals $V_{OUTP}$ and $V_{OUTM}$ in FIG. 2, and output signals $V_{OUTP1}$ and $V_{OUTM1}$ in FIG. 3 are not affected by slew rate limit transitions that occur in their respective operational amplifiers. Removal of the slew-rate limit effect allows for less distortion, and therefore more linear operation when filters 40 and 80 are used to provide a continuous time output signal.

While the invention has been described in the context of a preferred embodiment, it will be apparent to those skilled in the art that the present invention may be modified in numerous ways and may assume many embodiments other than that specifically set out and described above. For example, FIG. 2 and FIG. 3 each illustrates a fully differential switched-capacitor biquad low pass filter. It should be apparent to one skilled in the art that filters 40 and 80 could be modified for receiving single-ended input signals and for providing single-ended output signals. Accordingly, it is intended by the appended claims to cover all modifications of the invention which fall within the true spirit and scope of the invention.

What is claimed is:

1. A switched-capacitor filter, comprising:
   a first switching element having a first terminal for receiving a first input signal, and a second terminal;
   a first capacitive element having a first plate electrode coupled to the second terminal of the first switching element, and a second plate electrode;
   a first amplifier having a first input terminal coupled to the second plate electrode of the first capacitive element, and a first output terminal;
   a second switching element having a first terminal coupled to the first output terminal of the first amplifier, and a second terminal coupled to the first input terminal of the first amplifier;
   a third switching element having a first terminal coupled to first input terminal of the first amplifier, and a second terminal;
   a second capacitive element having a first plate electrode coupled to the second terminal of the third switching element, and a second plate electrode coupled to the first output terminal of the first amplifier;
   a fourth switching element having a first terminal coupled to the first output terminal of the first amplifier, and a second terminal;
   a third capacitive element having a first plate electrode coupled to the second terminal of the fourth switching element, and a second plate electrode;
   a fifth switching element having a first terminal coupled to a reference voltage terminal, and a second terminal coupled to the second plate electrode of the third capacitive element;
   a sixth switching element having a first terminal coupled to the second terminal of the fourth switching element, and a second terminal;
   a seventh switching element having a first terminal coupled to the second terminal of the fifth switching element, and a second terminal;
   a second amplifier having a first input terminal coupled to the second terminal of the seventh switching element, and a first output terminal coupled to the second terminal of the sixth switching element for providing a first output signal;
   a fourth capacitive element having a first plate electrode coupled to the first output terminal of the second amplifier, and a second plate electrode coupled to the first input terminal of the second amplifier; and
   an eighth switching element having a first terminal coupled to the first output terminal of the second amplifier, and a second terminal coupled to the second terminal of the first switching element.

2. The switched-capacitor filter of claim 1, wherein the second and seventh switching elements are responsive to a first clock signal, the third and fifth switching elements are responsive to a second clock signal, the first and sixth switching elements are responsive to a third clock signal, the fourth switching element is responsive to a fourth clock signal, and the eighth switching element is responsive to a fifth clock signal.

3. The switched-capacitor filter of claim 2, wherein the first and second clock signals are characterized as being non-overlapping clock signals.

4. The switched-capacitor filter of claim 1, wherein the reference voltage terminal receives a potential that is approximately equal to one-half of a signal swing of the first input signal.

5. The switched-capacitor filter of claim 1, wherein the first, fourth, sixth, and eighth switching elements are transmission gates, each transmission gate having a P-channel transistor and an N-channel transistor coupled together in parallel.

6. The switched-capacitor filter of claim 1, wherein the first and second amplifiers are differential amplifiers.

7. The switched-capacitor filter of claim 1, further comprising:
   a ninth switching element having a first terminal for receiving a second input signal, and a second terminal;
   a fifth capacitive element having a first plate electrode coupled to the second terminal of the ninth switching element, and a second plate electrode coupled to a second input terminal of the first amplifier;
   a tenth switching element having a first terminal coupled to a second output terminal of the first amplifier, and a second terminal coupled to the second input terminal of the first amplifier;
   an eleventh switching element having a first terminal coupled to the second input terminal of the first amplifier, and a second terminal;
   a sixth capacitive element having a first plate electrode coupled to the second terminal of the eleventh switching element, and a second plate electrode coupled to a second output terminal of the first amplifier;
   a twelfth switching element having a first terminal coupled to the second output terminal of the first amplifier, and a second terminal;
   a seventh capacitive element having a first plate electrode coupled to the second terminal of the twelfth switching element, and a second plate electrode;
   a thirteenth switching element having a first terminal coupled to the reference voltage terminal, and a second terminal coupled to the second plate electrode of the seventh capacitive element;
   a fourteenth switching element having a first terminal coupled to the second terminal of the twelfth switching element, and a second terminal coupled to a second output terminal of the second amplifier;
   a fifteenth switching element having a first terminal coupled to the second terminal of the thirteenth switching element, and a second terminal coupled to a second input terminal of the second amplifier;
   an eighth capacitive element having a first plate electrode coupled to the second output terminal of the second amplifier, and a second plate electrode coupled to the second input terminal of the second amplifier; and
   a sixteenth switching element having a first terminal coupled to the second output terminal of the second amplifier, and a second terminal coupled to the second terminal of the ninth switching element.

8. The switched-capacitor filter of claim 7, further comprising a common-mode circuit, coupled to the first and second output terminals of the first amplifier, for sensing a common-mode voltage between the first and second output terminals and providing a common-mode voltage to a common-mode input terminal of the first amplifier.

9. The switched-capacitor filter of claim 8, wherein the common-mode circuit further comprises:

a first capacitive element having a first plate electrode coupled to the first output terminal of the first amplifier and a second plate electrode;

a second capacitive element having a first plate electrode coupled to the second plate electrode of the first capacitive element of the common-mode circuit, and a second plate electrode of coupled to the second output terminal of the first amplifier; and a buffer circuit, coupled to the first and second output terminals of the first amplifier, for isolating the first and second output terminals of the first amplifier from transient signals.

10. A switched-capacitor filter, comprising:

a first switching element having a first terminal for receiving a first input signal, and a second terminal;

a first capacitive element having a first plate electrode coupled to the second terminal of the first switching element, and a second plate electrode;

a second switching element having a first terminal coupled to the second plate electrode of the first capacitive element, and a second terminal coupled to a reference voltage terminal;

a third switching element having a first terminal coupled to the second plate electrode of the first capacitive element, and a second terminal;

a first amplifier having a first input terminal coupled to the second terminal of the third switching element, and a first output terminal;

a second capacitive element having a first plate electrode coupled to the first output terminal of the first amplifier, and a second plate electrode coupled to the first input terminal of the first amplifier;

a fourth switching element having a first terminal coupled to the first output terminal of the first amplifier, and a second terminal;

a third capacitive element having a first plate electrode coupled to the second terminal of the fourth switching element, and a second plate electrode;

a fifth switching element having a first terminal coupled to the second plate electrode of the third capacitive element, and a second terminal coupled to the reference voltage terminal;

a sixth switching element having a first terminal coupled to the first plate electrode of the third capacitive element, and a second terminal;

a seventh switching element having a first terminal coupled to the second plate electrode of the third capacitive element, and a second terminal;

a second amplifier having a first input terminal coupled to the second terminal of the seventh switching element, and a first output terminal coupled to the second terminal of the sixth switching element, the first output terminal of the second amplifier for providing a first output signal;

a fourth capacitive element having a first plate electrode coupled to the first output terminal of the second amplifier, and a second plate electrode coupled to the first input terminal of the second amplifier; and an eighth switching element having a first terminal coupled to the first output terminal of the second amplifier, and a second terminal coupled to the first plate electrode of the first capacitive element.

11. The switched-capacitor filter of claim 10, wherein the second and seventh switching elements are responsive to a first clock signal, the third and fifth switching elements are responsive to a second clock signal, the first and sixth switching elements are responsive to a third clock signal, and the fourth and eighth switching elements are responsive to a fourth clock signal.

12. The switched-capacitor filter of claim 11, wherein the first and second clock signals are characterized as being nonoverlapping clock signals.

13. The switched-capacitor filter of claim 10, wherein the reference voltage terminal receives a potential that is approximately equal to one-half of a signal swing of the first input signal.

14. The switched-capacitor filter of claim 10, wherein the first, fourth, sixth, and eighth switching elements are transmission gates, each transmission gate having a P-channel transistor and an N-channel transistor coupled together in parallel.

15. The switched-capacitor filter of claim 10, wherein the first and second amplifiers are differential amplifiers.

16. The switched-capacitor filter of claim 10, further comprising:

a ninth switching element having a first terminal for receiving a second input signal, and a second terminal;

a fifth capacitive element having a first plate electrode coupled to the second terminal of the ninth switching element, and a second plate electrode;

a tenth switching element having a first terminal coupled to the second plate electrode of the fifth capacitive element, and a second terminal coupled to the reference voltage terminal;

an eleventh switching element having a first terminal coupled to the second plate electrode of the fifth capacitive element, and a second terminal coupled to a second input terminal of the first amplifier;

a sixth capacitive element having a first plate electrode coupled to a second output terminal of the first amplifier, and a second plate electrode coupled to the second input terminal of the first amplifier;

a twelfth switching element having a first terminal coupled to the second output terminal of the first amplifier, and a second terminal;

a seventh capacitive element having a first plate electrode coupled to the second terminal of the twelfth switching element, and a second plate electrode;

a thirteenth switching element having a first terminal coupled to the second plate electrode of the seventh capacitive element, and a second terminal coupled to the reference voltage terminal;

a fourteenth switching element having a first terminal coupled to the first plate electrode of the seventh capacitive element, and a second terminal coupled to a second output terminal of the second amplifier;

a fifteenth switching element having a first terminal coupled to the second plate electrode of the seventh capacitive element, and a second terminal coupled to a second input terminal of the second amplifier;

an eighth capacitive element having a first plate electrode coupled to the second output terminal of the second amplifier, and a second plate electrode coupled to the second input terminal of the second amplifier; and a sixteenth switching element having a first terminal coupled to the second output terminal of the second amplifier, and a second terminal coupled to the first plate electrode of the fifth capacitive element.

17. The switched-capacitor filter of claim 16, further comprising a common-mode circuit, coupled to the first and second output terminals of the first amplifier, for sensing a common-mode voltage between the first and second output terminals and providing a common-mode voltage to a common-mode input terminal of the first amplifier.

18. The switched-capacitor filter of claim 17, wherein the common-mode circuit further comprises:
- a first capacitive element having a first plate electrode coupled to the first output terminal of the first amplifier and a second plate electrode;
- a second capacitive element having a first plate electrode coupled to the second plate electrode of the first capacitive element of the common-mode circuit, and a second plate electrode coupled to the second output terminal of the first amplifier; and
- a buffer circuit, coupled to the first and second output terminals of the first amplifier, for isolating the first and second output terminals of the first amplifier from transient signals.

19. A switched-capacitor biquad low pass filter, comprising:
- a differential switched-capacitor integrator for receiving first and second input signals at first and second input nodes, and in response to a first clock signal being active, providing first and second intermediate signals at first and second intermediate nodes;
- a differential lossy switched-capacitor integrator, coupled to the first and second intermediate nodes, for receiving the first and second intermediate signals, and in response to a second clock signal being active, providing first and second output signals at first and second output nodes;
- a feedback circuit for coupling the first and second input nodes to the first and second output nodes in response to a third clock signal becoming active, the third clock signal generated from the first clock signal and becoming active a predetermined time after the first clock signal becomes active;
- a first common-mode circuit, coupled to the first and second intermediate nodes, for controlling a common-mode voltage between the first and second intermediate nodes; and
- a second common-mode circuit, coupled to the first and second output nodes, for controlling a common-mode voltage between the first and second intermediate nodes.

20. The switched-capacitor filter of claim 19, wherein the first common-mode circuit comprises:
- a first capacitive element having a first plate electrode coupled to the first intermediate node, and a second plate electrode;
- a second capacitive element having a first plate electrode coupled to the second plate electrode of the first capacitive element of the first common-mode circuit, and a second plate electrode coupled to the second intermediate node; and
- a buffer circuit, coupled to the first and second intermediate nodes, for isolating the first and second intermediate nodes from transient signals.

21. The switched-capacitor filter of claim 19, wherein the first and second clock signals are characterized as being nonoverlapping, out-of-phase clock signals.

* * * * *